United States Patent
Wu

(10) Patent No.: US 8,008,924 B2
(45) Date of Patent: Aug. 30, 2011

(54) DETECTING CIRCUIT

(75) Inventor: Chuan-Feng Wu, Taipei Hsien (TW)

(73) Assignee: Hon Hai Precision Industry Co., Ltd., Tu-Cheng, New Taipei (TW)

( * ) Notice: Subject to any disclaimer, the term of this patent is extended or adjusted under 35 U.S.C. 154(b) by 588 days.

(21) Appl. No.: 12/202,326

(22) Filed: Sep. 1, 2008

(65) Prior Publication Data

US 2009/0243646 A1  Oct. 1, 2009

(30) Foreign Application Priority Data

Mar. 28, 2008 (CN) .......................... 2008 1 0300778

(51) Int. Cl.
*G01N 27/42* (2006.01)
(52) U.S. Cl. ......... 324/426; 324/425; 324/432; 324/437
(58) Field of Classification Search ................. None
See application file for complete search history.

(56) References Cited

U.S. PATENT DOCUMENTS

| 4,079,444 A | * | 3/1978 | Kuhn | ............................ 363/56.07 |
| 5,281,919 A | * | 1/1994 | Palanisamy | .................... 324/427 |
| 6,828,793 B2 | | 12/2004 | Mashiko | |

* cited by examiner

*Primary Examiner* — Huy Q Phan
*Assistant Examiner* — Son Le
(74) *Attorney, Agent, or Firm* — Altis Law Group, Inc.

(57) ABSTRACT

A detecting circuit for detecting a battery having a first and second electrode, includes a contacting portion electrically connecting to the first electrode of the battery, a seesaw electrically connected to the second electrode of the battery, and an actuator electrically connecting to the second electrode of the battery. One end of the seesaw electrically contacts with the contacting portion when the battery have a protection circuit. The actuator is configured for providing power onto another end of the seesaw to separate the contacting portion with the seesaw when the battery has no a protection circuit. The detecting circuit can truly and handily judges whether the detected battery has the protection circuit according to the action of the seesaw.

7 Claims, 4 Drawing Sheets

DETECTING CIRCUIT

BACKGROUND

1. Technical Field of the Invention

The present invention relates to a detecting circuit and, in particular, to a detecting circuit for detecting whether a battery has a protection circuit.

2. Description of Related Art

Batteries can be used for a variety of purposes, but generally must be operated in accordance with various criteria to ensure the safety and reliability of the batteries and the devices using them. Protection circuits have been developed for regulating the use of lithium batteries widely used in electronic devices, such as mobiles, PDAs, and digital cameras. A protection circuit may be needed in the context of protecting high voltage or currents to meet the various criteria. However, certain batteries that are currently available on the market have no the protection circuit, thereby exposing the electronic devices that use such batteries to potential damage.

It is desired, therefore, to provide a detecting circuit which can detect whether a battery has a protection circuit.

SUMMARY

In accordance with an embodiment of the present invention, a detecting circuit for detecting a battery having a first and second electrode includes a contacting portion electrically connecting to the first electrode of the battery, a seesaw electrically connecting to the second electrode of the battery, and an actuator electrically connecting to the second electrode of the battery. One end of the seesaw electrically contacts with the contacting portion when the battery has a protection circuit. The actuator is configured for providing power onto another end of the seesaw to separate the contacting portion with the seesaw when the battery has no protection circuit.

Other novel features and advantages will become more apparent from the following detailed description when taken in conjunction with the accompanying drawings.

BRIEF DESCRIPTION OF THE DRAWINGS

The present invention is described in detail hereinafter, by way of example and description of preferred and exemplary embodiments thereof and with references to the accompanying drawings, in which.

DETAILED DESCRIPTION OF EXEMPLARY EMBODIMENTS

A detailed explanation of a detecting circuit according to an exemplary embodiments of the present invention will now be made with references to the drawings attached hereto.

Figure 1:
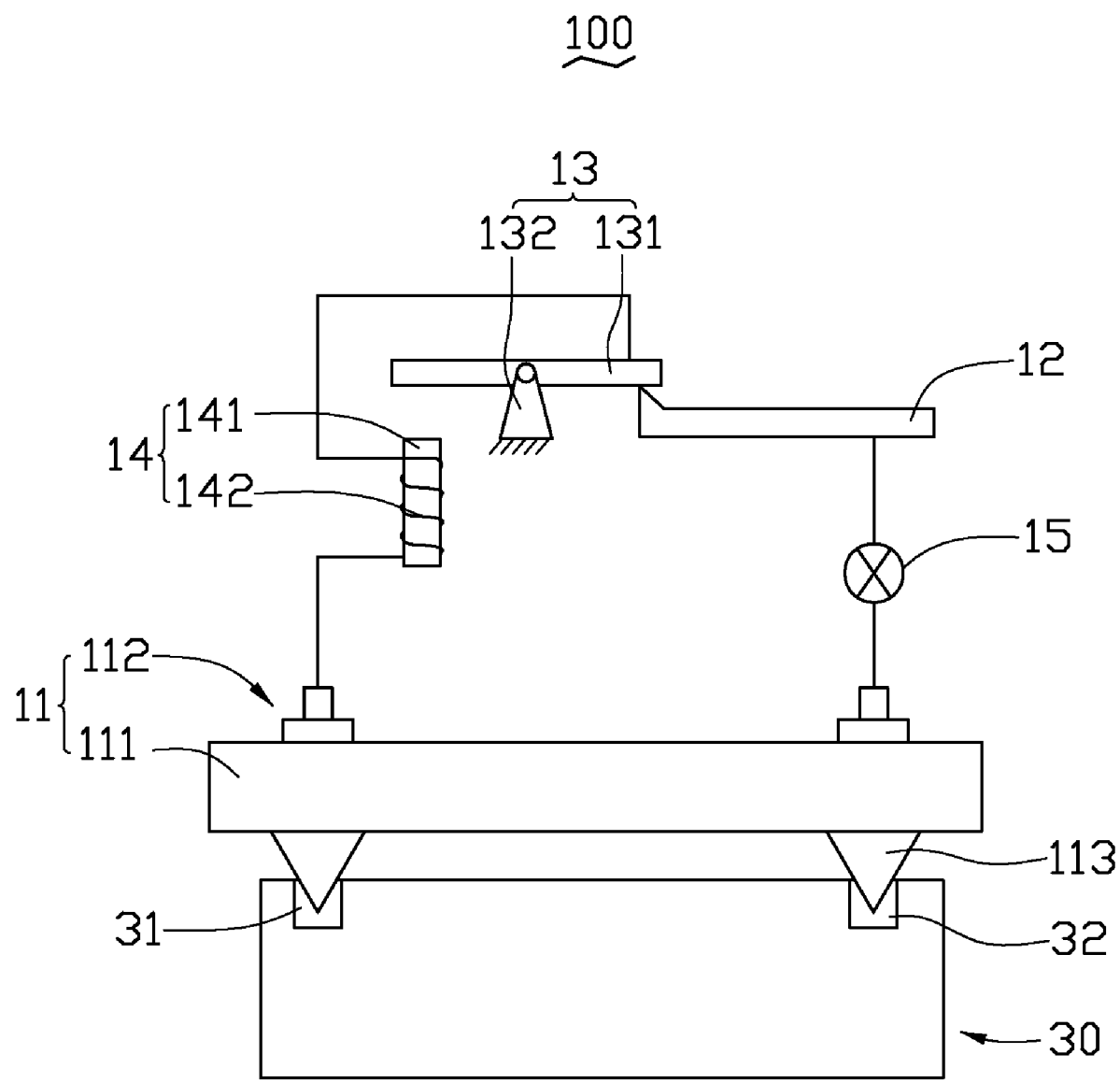
FIG. 1 shows a schematic diagram in accordance with a first embodiment of a detecting circuit of the present invention.

Referring to FIGS. 1, a detecting circuit 100 according to a first embodiment is shown. The detecting circuit 100 is used for detecting whether a battery 30 has a protection circuit. The battery 30 includes two electrodes 31, 32, of which one is positive electrode and the other is a negative electrode. The detecting circuit 100 includes a connecting apparatus 11 electrically connecting to the two electrodes 31, 32, a contacting portion 12 electrically connecting to the connecting apparatus 11, a seesaw 13, and an actuator 14 electrically connecting to the connecting apparatus 11.

Figure 2:
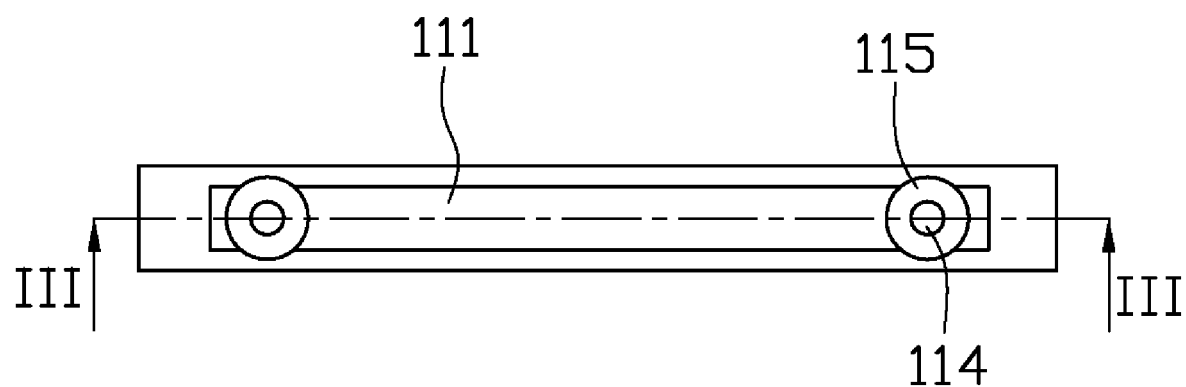
FIG. 2 shows a connecting apparatus of the detecting circuit of FIG. 1.
Figure 3:
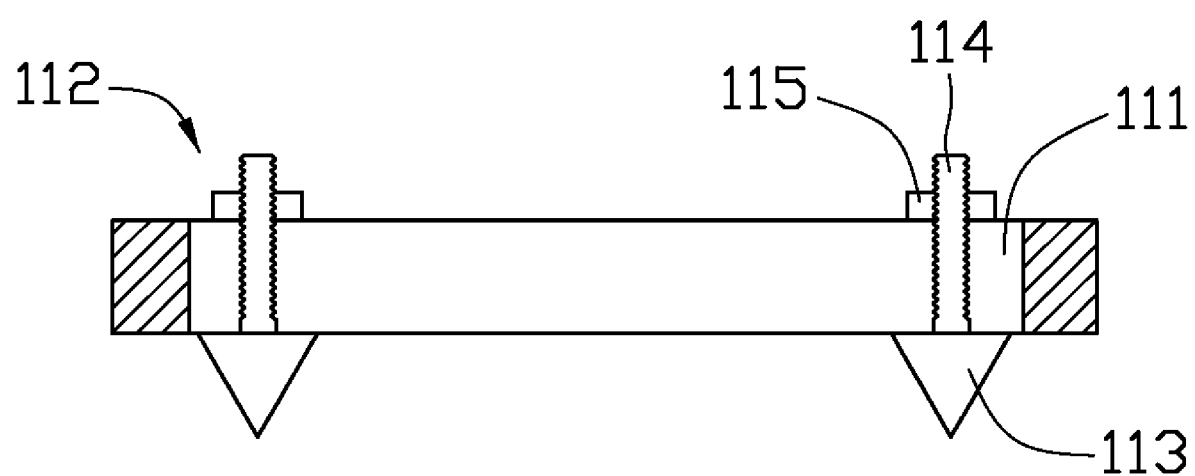
FIG. 3 is a cross-sectional view of the connecting apparatus of FIG. 2, taken along the line III-III.

Referring to FIGS. 2-3, the connecting apparatus 11 is structured so as to be compatible with batteries of different scales, i.e., different pitches between the electrodes. The connecting apparatus 11 includes a guiding slot 111 and two contacting feet 112 slidably received in the guiding slot 111. Each of the two contacting feet 112 includes a body 113, a threaded post 114 connected to the body 113, and a nut 115 threadedly engaged at the threaded post 114. The threaded post 114 passes through the guiding slot 111 with one end thereof fixed to the body 113 and the other end engaged by the nut 115. When the distance between the two contacting feet 112 need to be changed, the nut 115 can be loosened and the contacting feet 112 can slide along the guiding shot 111 so as to change the distance between the contacting feet 112, thereby adjusted to various battery sizes.

The contacting portion 12 is a metal pad electrically connecting to one of the two contacting feet 112 and configured for separately connecting to the seesaw 13, electrically.

The actuator 14 is an electromagnetic assembly in this embodiment and includes an iron 141 and a windings 142 wrapped around the iron 141. The actuator 14 is electrically connected to another contacting portion 112. When a current passes through the windings 142 of the actuator 14, the actuator 14 can generate a magnetic force.

The seesaw 13 is interposed between the actuator 14 and the contacting portion 12 and includes a metal board 131 electrically connecting to the actuator 14 and a fulcrum 132 fixed on a base (not shown). When the detected battery 30 has a protection circuit, or if no current passes through the detecting circuit 100, the metal board 131 electrically interconnects to the contacting portion 12. When the detected battery 30 has no protection circuit, the current in the detecting circuit 100 can increase. Thus, the magnetic force generated by the actuator 14 increases. As a result, the metal board 131 is ridden down by the magnetic force and is separated with the contacting portion 12.

The detecting circuit 100 further includes a pilot lamp 15. The pilot lamp 15 may be a light emitting diode and configured for indicating whether the detected battery has a protection circuit. When the pilot lamp 15 emits light all along, it indicates that the detected battery has no the protection circuit. If not, it indicates the detected battery has a protection circuit.

As described above, the detecting circuit 100 can accurately determine whether the detected battery has the protection circuit according to the action of the metal board 131 of the seesaw or the pilot lamp 15.

Figure 4:
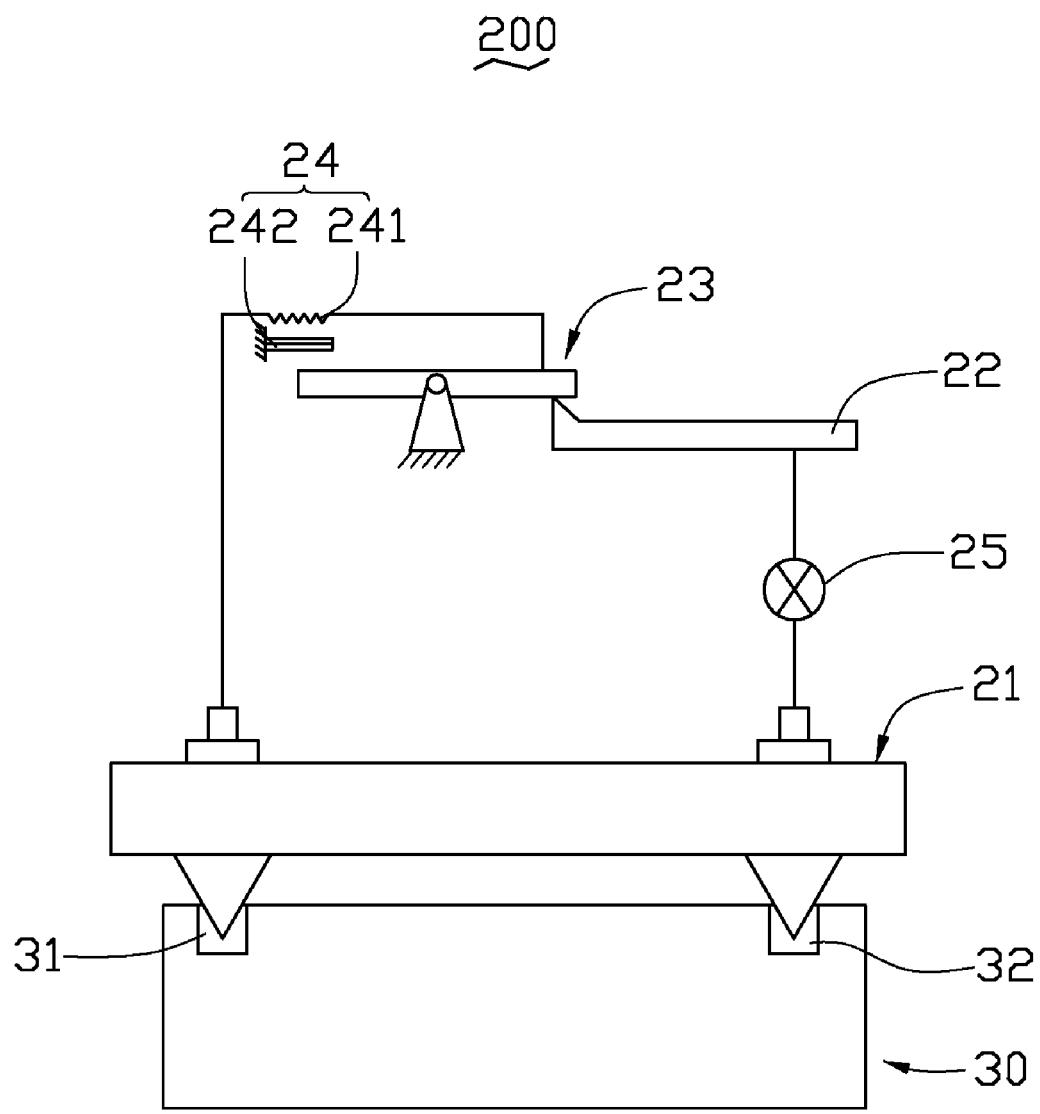
FIG. 4 shows a second embodiment of the detecting circuit.

Referring to FIG. 4, a detecting circuit 200 according to a second embodiment is shown. The detecting circuit 200 includes a connecting apparatus 21, electrically connecting to the two electrodes 31, 32, a contacting portion 22 electrically connecting to the connecting apparatus 21, a seesaw 23, an actuator 24 electrically connecting to the connecting apparatus 21, and a pilot lamp 25.

The differences between the second embodiment and the first embodiment are that the actuator 24 includes a heat conductor 241 and a heat-sensitive assembly 242 connected to the heat conductor 241 in the second embodiment. The heat conductor 241 is electrically connected to the connecting apparatus 21 for generating heat by current. The heat-sensitive assembly 242 is made of two different materials having different ductility. Thus, when a current passes through the heat conductor 241, heat generated by the heat conductor 241 is transmitted into the heat-sensitive assembly 242. As a result, the end of the heat-sensitive assembly 242 warps toward a side in which the material has a less ductility.

In use, when the detected battery 30 has a protection circuit, or if no current passes through the detecting circuit 100, the end of the heat-sensitive assembly 242 can not press the metal board 231, and the metal board 231 is still electrically connected to the contacting portion 22. When the detected battery 30 has no protection circuit, the current passing through the detecting circuit 200 can increase. As a result, the heat generated by the heat conductor 241 increases, the end of the heat-sensitive assembly 242 can press the metal board 231 and the metal board 131 is ridden down, which separate the metal board 131 and the contacting portion 12.

It should be understood that the above-described embodiments are intended to illustrate rather than limit the invention. Variations may be made to the embodiments without departing from the spirit of the invention. Accordingly, it is appropriate that the appended claims be construed broadly and in a manner consistent with the scope of the invention.

What is claimed is:

1. A detecting circuit for detecting a battery having a first and second electrode, comprising:
    a contacting portion electrically connecting to the first electrode of the battery;
    a seesaw electrically connecting to the second electrode of the battery, one end of the seesaw electrically contacting with the contacting portion when the battery has a protection circuit; and
    an actuator electrically connecting to the second electrode of battery, the actuator being configured for providing power onto another end of the seesaw to separate the contacting portion with the seesaw when the battery has no a protection circuit.

2. The detecting circuit as claimed in claim 1, wherein the actuator comprises an electromagnetic member.

3. The detecting circuit as claimed in claim 1, wherein the actuator comprises a heat conductor and a heat-sensitive assembly connected to the heat conductor.

4. The detecting circuit as claimed in claim 1, further comprising a connecting apparatus comprising two contacting feet configured for electrically contacting the first and second electrodes of the battery, respectively, the contacting portion and the seesaw being respectively connected to the first and second electrodes via the two contacting feet correspondingly.

5. The detecting circuit as claimed in claim 4, wherein the connecting apparatus comprises a guiding slot for receiving the two contacting feet, wherein the two contacting feet are slidable along the guiding slot.

6. The detecting circuit as claimed in claim 1, further comprising a pilot lamp electrically connected between the first electrode and the contacting portion.

7. The detecting circuit as claimed in claim 6, wherein the pilot lamp is a light emitting diode.

\* \* \* \* \*